United States Patent
Ke et al.

(10) Patent No.: US 10,495,543 B2
(45) Date of Patent: Dec. 3, 2019

(54) VORTEX IDENTIFICATION METHODS AND TOOLS

(71) Applicant: ROLLS-ROYCE plc, London (GB)

(72) Inventors: Yiping Ke, Singapore (SG); Jian Cheng Wong, Singapore (SG); Chi-Keong Goh, Singapore (SG); Kee Khoon Lee, Singapore (SG)

(73) Assignee: ROLLS-ROYCE plc, London (GB)

( * ) Notice: Subject to any disclaimer, the term of this patent is extended or adjusted under 35 U.S.C. 154(b) by 110 days.

(21) Appl. No.: 15/172,637

(22) Filed: Jun. 3, 2016

(65) Prior Publication Data

US 2016/0377504 A1 Dec. 29, 2016

(30) Foreign Application Priority Data

Jun. 29, 2015 (GB) .................................. 1511342.6

(51) Int. Cl.
*G01M 10/00* (2006.01)
*G06F 17/50* (2006.01)

(52) U.S. Cl.
CPC .......... *G01M 10/00* (2013.01); *G06F 17/5009* (2013.01)

(58) Field of Classification Search
CPC ........................... G01M 10/00; G06F 17/5009
See application file for complete search history.

(56) References Cited

U.S. PATENT DOCUMENTS

| | | | | |
|---|---|---|---|---|
| 6,152,130 A | * | 11/2000 | Abrams | A61M 15/0085 128/203.12 |
| 2005/0183725 A1 | * | 8/2005 | Gumaste | A61M 15/0085 128/203.15 |
| 2005/0273278 A1 | * | 12/2005 | Sprague | G01F 1/3209 702/45 |
| 2010/0107776 A1 | * | 5/2010 | Shanahan | G01F 1/60 73/861.11 |
| 2010/0125377 A1 | * | 5/2010 | Kim | G01R 31/2862 700/300 |
| 2011/0144928 A1 | * | 6/2011 | Watanabe | G06F 17/5018 702/50 |
| 2011/0272032 A1 | * | 11/2011 | Varaksin | E04H 9/14 137/1 |

(Continued)

OTHER PUBLICATIONS

Pemberton et al, a Novel Method for Identifying Vortical Structures, 2002.*

(Continued)

*Primary Examiner* — Stephanie E Bloss
*Assistant Examiner* — Mohammad K Islam
(74) *Attorney, Agent, or Firm* — Oliff PLC

(57) ABSTRACT

A vortex detection method is described. The method comprises storing a plurality of points at locations over a region (32) in which vortex detection is to be performed. A value for each of a plurality of fluid flow parameters, such as velocity, pressure and density, is determined at each point. The points are grouped as being contained in either a vortical flow portion or non-vortical flow portion of the region according to one or more statistical distribution for said fluid flow parameters. A point (p) in a vortex core is identified according to the direction of motion of an array of further points (46) relative to said point in the vortex core. The further points (46) may surround the vortex core point.

18 Claims, 3 Drawing Sheets

(56) References Cited

U.S. PATENT DOCUMENTS

| | | | | |
|---|---|---|---|---|
| 2012/0028342 | A1* | 2/2012 | Ismagilov | B01L 3/502738 435/283.1 |
| 2012/0139259 | A1* | 6/2012 | Glezer | F03G 6/04 290/55 |
| 2014/0208768 | A1* | 7/2014 | Bacic | F01D 5/082 60/782 |
| 2014/0257772 | A1* | 9/2014 | Perot | G06F 17/5009 703/2 |
| 2014/0350899 | A1* | 11/2014 | Lu | G06F 17/5009 703/2 |
| 2015/0017385 | A1* | 1/2015 | Lang | F15D 1/003 428/141 |
| 2015/0047352 | A1* | 2/2015 | Glezer | F02C 1/05 60/641.8 |
| 2016/0140730 | A1* | 5/2016 | Falahatpisheh | G01S 15/8984 382/131 |
| 2016/0153825 | A1* | 6/2016 | Mangalam | G01P 5/01 73/1.16 |

OTHER PUBLICATIONS

Reynolds, Gaussian Mixture Models, 2007.*
Wang, Yunhai et al., "Efficient Volume Exploration Using the Gaussian Mixture Model.", IEEE Transactions on Visualization and Computer Graphics, vol. 17, No. 11, pp. 1560-1573, (2011).
Viikmáe, Bert et al., "Quantification and characterization of mesoscale eddies with different automatic identification algorithms.", Journal of Coastal Research, vol. 165, pp. 2077-2082, (2013).
Jiang, Ming et al., "Geometric verification of swirling features in flow fields.", IEEE VIS 2002 Proceedings, pp. 307-314, (2002).
Sadarjoen, Ari et al., "Geometric Methods for Vortex Extraction.", Proceedings of the Joint Eurographics and IEEE TCVG Symposium on Visualization, pp. 53-62, (1999).
Nov. 17, 2016 European Search report issued in Patent Application No. 16172872.
Strawn et al. "Computer Visualization of Vortex Wake Systems". AIAA Journal, vol. 37, No. 4, 511-512, 1999.
Banks et al., "A Predictor-Corrector Technique for Visualizing Unsteady Flow". IEEE Transactions on Visualization and Computer Graphics, vol. 1, No. 2, 151-163, 1995.
Jiang et al., "A Novel Approach to Vortex Core Region Detection". Joint Eurographics—IEEE TCVG Symposium on Visualization, 2002.
Roth et al., "A Higher-Order Method for Finding Vortex Core Lines". Proceedings of the IEEE Visualization, 1998.
Jeong et al., "On the identification of a vortex". J. Fluid Mech., vol. 285, 69-94, 1995.
Sujudi et al., "Identification of Swirling Flow in 3-D Vector Fields". The American Institute of Aeronautics and Astronautics, Inc., 1995.
Levy et al., "Graphical Visualization of Vortical Flows by Means of Helicity". AIAA Journal, vol. 28, No. 8, 1347-1352, 1990.
Sadarjoen et al., "Geometric Methods for Vortex Extraction". Joint Eurographics—IEEE TCVG Symposium on Visualization,1999.
Berdahl et al., "Eduction of Swirling Structure Using the Velocity Gradient Tensor". AIAA Journal, vol. 31, No. 1, 97-103, 1993.
Dec. 22, 2015 Search Report issued in Great Britain Patent Application No. 1511342.6.

* cited by examiner

VORTEX IDENTIFICATION METHODS AND TOOLS

BACKGROUND OF THE INVENTION

The present invention relates to methods and tools for identifying vortices within a fluid flow.

The understanding of vortices/recirculations within fluid flows is an important engineering consideration, particularly, although not exclusively in the design of components or assemblies that are intended to interact with a fluid flow in use, i.e. so-called 'fluid-washed' components. This is especially the case for aerodynamic components, such as aerofoils, for which the efficiency of operation is dependent upon the manner in which the component affects the adjacent/surrounding fluid flow.

It is an engineering aim to be able to locate vortices accurately. The presence of a vortex on or adjacent a surface of a fluid-washed component can reduce aerodynamic efficiency and potentially cause other abnormal machine behaviour or even failure. Whilst it is possible to test physical components and flow regimes using conventional equipment such as wind tunnels and the like, there is a general trend, as in other areas of engineering, towards the use of computational modelling of fluid flow. Such computational techniques allow a deeper understanding/analysis of flow regimes and also allow changes to designs and test conditions to be implemented quickly and cost-effectively, thereby increasing the ability to experiment with alterations.

The inventor has assessed a number of different computational techniques for identifying vortices in a fluid flow as identified below:

Graphical Visualization of Vortical Flows by Means of Helicity (Y. Levy, D. Degani, and A. Seginer. AIAA J., 28(8):1347-1352, 1990) suggests identifying vortices using helacity, which is defined as the cosine of the angle between velocity v and vorticity w. The underlying assumption of the algorithm is that, near vortex core regions, the angle between v and w is small, which corresponds to a big helicity value. The detection algorithm locates points with maximum helicity values and traces streamlines from these maximum points.

Education of Swirling Structure using the Velocity Gradient Tensor (C. H. Berdahl and D. S. Thompson. AIAA J., 31(1):97-103, 1993) defines a swirl parameter $\tau$ based on the existence of complex eigenvalues in velocity gradient tensor J, as given by the following equation:

$$\tau = \frac{|\text{Im}(\lambda_C)|L}{2\pi|v_{conv}|},$$

where $\text{Im}(\lambda_C)$ is the imaginary part of the complex conjugate pair of eigenvalues of J, L is the characteristic length associated with the size of the region of complex eigenvalues $R_C$, and $v_{conv}$ is the convection velocity aligned along L. The basic idea of the detection algorithm is that, $\tau$ is non-zero in regions containing vortices and achieves a local maximum at vortex core.

On the Identification of a Vortex (J. Jeong and F. Hussain. J. Fluid Mechanics, 285:69-94, 1995), the velocity gradient tensor J is decomposed into its symmetric part S, and its anti-symmetric part $\Omega$. That is, $S=(J+J^T)/2$; and $\Omega=(J-J^T)/2$. The vortex is defined as a connected region where two of the three (real) eigenvalues of the symmetric matrix $(S^2+\Omega^2)$ are negative. Thus, if the second highest eigenvalue $\lambda_2$ of $(S^2+\Omega^2)$ is negative at a point, then the point belongs to a vortex.

A Predictor-Corrector Technique for Visualizing Unsteady Flow (D. C. Banks and B. A. Singer. IEEE Trans. Visualization and Computer Graphics, 1(2): 151-163, 1995) defines vorticity $\omega$ as the curl of velocity v, which represents local flow rotation in terms of both speed and direction. This technique requires that vortices are sustained by pressure gradients and indicated by vorticity. Therefore, the algorithm detects vortex core lines by tracing vorticity lines (seeded with points that are of low pressure and high vorticity magnitude) and then correcting the detected lines based on local pressure minimum.

Identification of Swirling Flow in 3D Vector Fields (D. Sujudi and R. Haimes. In AIAA 12th CFD conf., Paper 95-1715, 1995) uses an eigenvector method, the underlying assumption being that the eigenvalues and eigenvectors of the velocity gradient tensor J, evaluated at a critical point, define the local flow pattern about that point. The algorithm thus searches for points where J has one real and two complex conjugate eigenvalues. If the eigenvector of the real eigenvalue is parallel to the velocity vector, then the point is determined to be part of the vortex core.

A Higher-Order Method for Finding Vortex Core Lines (M. Roth and R. Peikert. In IEEE Visualization '98, pages 143-150, 1998) uses higher-order derivatives of velocity v to detect vortex core lines. It is observed that the eigenvector method is equivalent to finding points of zero torsion. Thus, the second-order derivative w of v is computed and a vortex core line consists of the points where v is parallel to w.

Computer Visualization of Vortex Wake Systems (R. C. Strawn, D. N. Kenwright, and J. Ahmad. AIAA J., 37(4): 511-512, 1999) defines a vortex core as being a local maximum of vorticity magnitude $|\omega|$ in the plane normal to $\omega$. This method is designed specifically to detect multiple vortices in close proximity with the same orientation and overlapping cores.

The above-described techniques share a common theme that the definition of a vortex is based upon each author's own specific understanding or observation of what properties constitute, and therefore define, a vortex. Such diverse vortex definitions leave open the possibility that any one definition could identify or overlook a vortex where another definition does not. Accordingly, the prior art techniques are subjective in nature.

For most of the prior art techniques, there exists a problem that false positive vortex identifications are generated, i.e. where detected core lines or regions do not actually contain vortices. This can thus lead to errors or else an increase in post-processing efforts in order to verify the correctness of detected vortices by either manual visualization or designing feature verification algorithms, the verification accuracy of which may also be uncertain.

Some techniques can also generate false negatives, where vortices do exist but are not detected. The false negative problem is difficult to guard against since it is not straightforward to identify where or why vortices are missing using conventional techniques.

Furthermore, some of the techniques require users to specify thresholds for algorithm parameters in order to achieve best performance of the algorithms and, accordingly, there is margin for significant error due to the level of skill of the operator. Even for a skilled operator, it is not a straightforward task to ascertain the best thresholds and so another vortex detection technique may need to be used in order to validate/check the generated results.

It is an aim of the present invention to provide for vortex identification in a manner that substantially avoids or mitigates one or more of the above problems. It may be considered an aim of the invention to provide a more effective or objective vortex identification technique.

BRIEF SUMMARY OF THE INVENTION

According to a first aspect of the invention there is provided a vortex detection method comprising identifying a plurality of points at locations over a region in which vortex detection is to be performed, storing for each point a value for each of a plurality of fluid flow parameters, grouping the points as being contained in a vortical flow portion or non-vortical flow portion of the region according to one or more statistical distribution for said fluid flow parameters, and identifying a point in a vortex core according to the direction of motion of a plurality of further points relative to said point in the vortex core.

The location of a vortex may be defined according to the location of its vortex core, e.g. the location of a point determined to be at the core.

The method may involve, for a first point contained in vortical flow portion, identifying a plurality of further points surrounding said first point. The plurality of further points may comprise at least six or eight points. The plurality of further points may or may not comprise a generally circular array of points centred about the first point. The plurality of further points may be substantially equally spaced (e.g. angularly) about the first point.

The direction of motion of said further points may be determined, for example by way of a velocity vector or velocity angle. The change in velocity angle or direction between each further point and an adjacent further point may be determined. An aggregate or summation of the sequential changes in angle or direction between each successive further point about the first point may be determined. If the summation meets or exceeds a predetermined threshold value, the first point may be identified as lying in a vortex core. The threshold value may be 340°, 350° or substantially 360°.

The changes in angle between adjacent further points may be determined in a common sense, e.g. clockwise or anti-clockwise.

The method performed in respect of the first point may be repeated for a plurality or all points in the vortical flow portion. The method may or may not terminate when a point is found to lie within a vortex core.

The method of vortex detection is particularly robust and accurate, avoiding the need for experts to manually input parameters for guiding vortex detection according to domain knowledge. Furthermore the method of vortex detection is a fully data-driven approach, avoiding subjective vortex definitions and, instead, using data analytics to generate objective vortex identification results.

The method may be performed in a two dimensional plane, wherein each of said points are contained in said plane. The method may be repeated for a plurality of two dimensional planes, e.g. over a desired volume in which vortex detection is performed. Thus the plurality of planes may approximate the three-dimensional volume for example according to the number and spacing of planes used.

The method may group the points according a model corresponding to a probability distribution, e.g. a mixture distribution, for said fluid flow parameters. A clustering algorithm or procedure may be used. A Gaussian mixture model may be used.

The flow parameters may be distributed according to a mixture of components, with each component belonging to a common parametric family of distributions, but for example having with different distribution parameters. The mixture model may comprise a set of mixture weightings, each of which may be a probability, for example, all of which sum to one.

The flow parameters may comprise any or any combination of density, pressure and/or velocity, for example comprising a velocity component in any or any combination of orthogonal directions.

The method may comprise determining the value of each of said fluid flow parameters at each of the points. The determination of said fluid flow parameters may be made for example using a computational fluid dynamics tool, e.g. according to conservation of mass, energy and/or momentum at multiple points within the flow region under analysis. A mesh may be applied to the region, thereby defining adjoining spatial elements covering the region, for example such that the mesh represents the interfaces between the elements. The points may be defined at the nodes of the mesh and/or at the centre of the elements.

The method may comprise a method of designing or modifying the geometry of a fluid washed component, whereby the fluid flow region is defined as a region containing or adjacent to the surface of the component. The method may or may not comprise determining whether a vortex location is identified which impinges on the component surface. The method may comprise modifying the component surface geometry to cause an identified vortex to move away from the surface.

A vortex and/or vortex core may be identified using the invention under steady state or transient flow conditions.

The method may comprise a computer implemented method.

According to a second aspect of the invention, there is provided a data carrier comprising machine readable instructions for the control of one or more processor to perform the method of the first or fourth aspect.

According to a third aspect of the invention, there is provided a vortex detection tool comprising a data store on which is stored location data for a plurality of points over a fluid region in which vortex detection is to be performed and a plurality of fluid flow parameter values at each of said points, the tool further comprising one or more processor arranged group the points as being contained in a vortical flow portion or non-vortical flow portion of the region according to one or more statistical distribution for said fluid flow parameters, and to identify a point in a vortex core according to the direction of motion of a plurality further points relative to said point in the vortex core.

According to a fourth aspect of the invention, there is provided a method of identifying a vortex core within a fluid flow, comprising defining a plurality of primary points within a fluid flow region in which a vortex is to be identified and defining an array of further points surrounding each of said primary points and for each further point in the array, determining a change in direction of motion of the further point in the fluid flow relative to an adjacent further point in the array, wherein a vortex core is identified at a primary point for which an aggregate of all the changes in direction of the further points in the array is greater than or equal to a threshold value.

Each further point in the array may be selected so as to be approximately equidistant from the respective primary point.

Any of the essential or preferable features defined in relation to any one aspect of the invention may be applied to any further aspect. Accordingly the invention may comprise various alternative configurations of the features defined above.

BRIEF DESCRIPTION OF THE DRAWINGS

Practicable embodiments of the invention are described in further detail below by way of example only with reference to the accompanying drawings, of which.

DETAILED DESCRIPTION OF THE INVENTION

Figure 1:
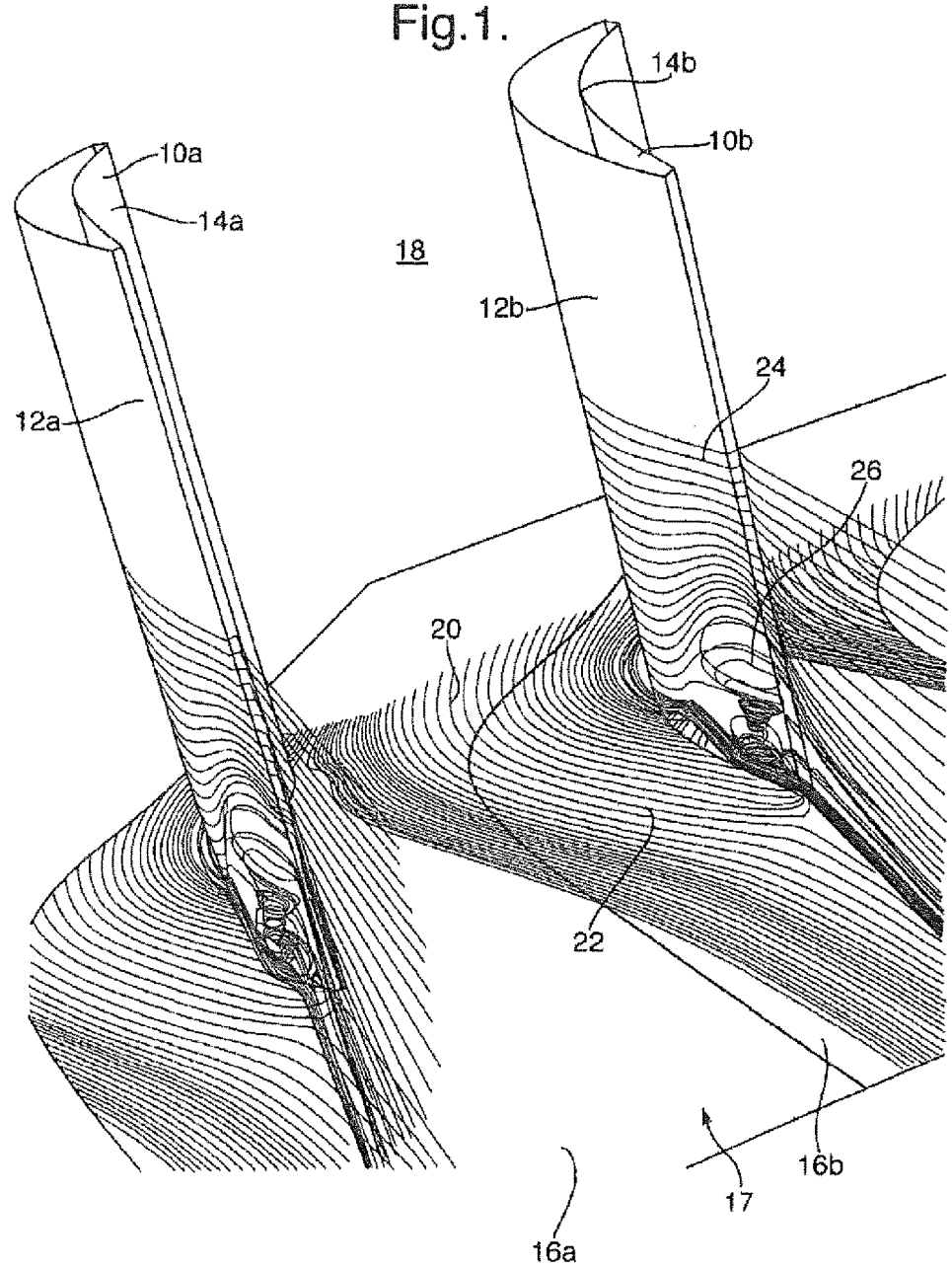
FIG. 1 shows a three-dimensional view of the flow over adjacent aerofoils according to the prior art.

FIG. 1 shows the results from a Computational Fluid Dynamics (CFD) simulation of the flow in a simple linear cascade of compressor blade rows for a gas turbine engine. Two adjacent aerofoils (10a, 10b) are shown, each having a suction surface (respectively 12a, 12b) and a pressure surface (14a, 14b). A platform (16a, 16b) is associated with each aerofoil (10a, 10b), the platforms (16a, 16b) being radially inward of the aerofoils and together defining an end wall 17. A flow passage (18) is defined by the surfaces 14a, 17 and 12b and by a shroud surface (not shown) radially outward of the aerofoils (10a, 10b). The model is viewed from the rear (from downstream looking upstream). Streamlines show the flow patterns on the end wall (17) and on the aerofoil suction surface (12b) for the lower half of the passage). The inlet main stream flow (20) is at the design incidence and velocity and shows a series of streamlines with no recirculation.

The over-turning of the fluid at the bottom of the inlet boundary layer is visible in the streamlines (22). This causes the airflow to impinge onto the suction surface (12b) of the aerofoil. On the aerofoil, near mid-height, the flow lines (24) generally follow the profile of the aerofoil surface. However, nearer the end wall (17), the streamlines on the aerofoil indicate a region of vortical flow (26), which causes separation of the boundary layer flow from the aerofoil. Vortex formation of this kind, adjacent the gas-washed surface of an aerofoil, or any other kind of aerodynamic component, causes flow efficiency losses. Accordingly it is desirable to be able to study flow regimes using a computational model to assess the suitability of different component geometries under relevant flow conditions. It is typically desirable to avoid vortex formation or else, if this is not possible, to ensure that a vortex is formed away from the component surface in order to improve aerodynamic efficiency.

Figure 2:
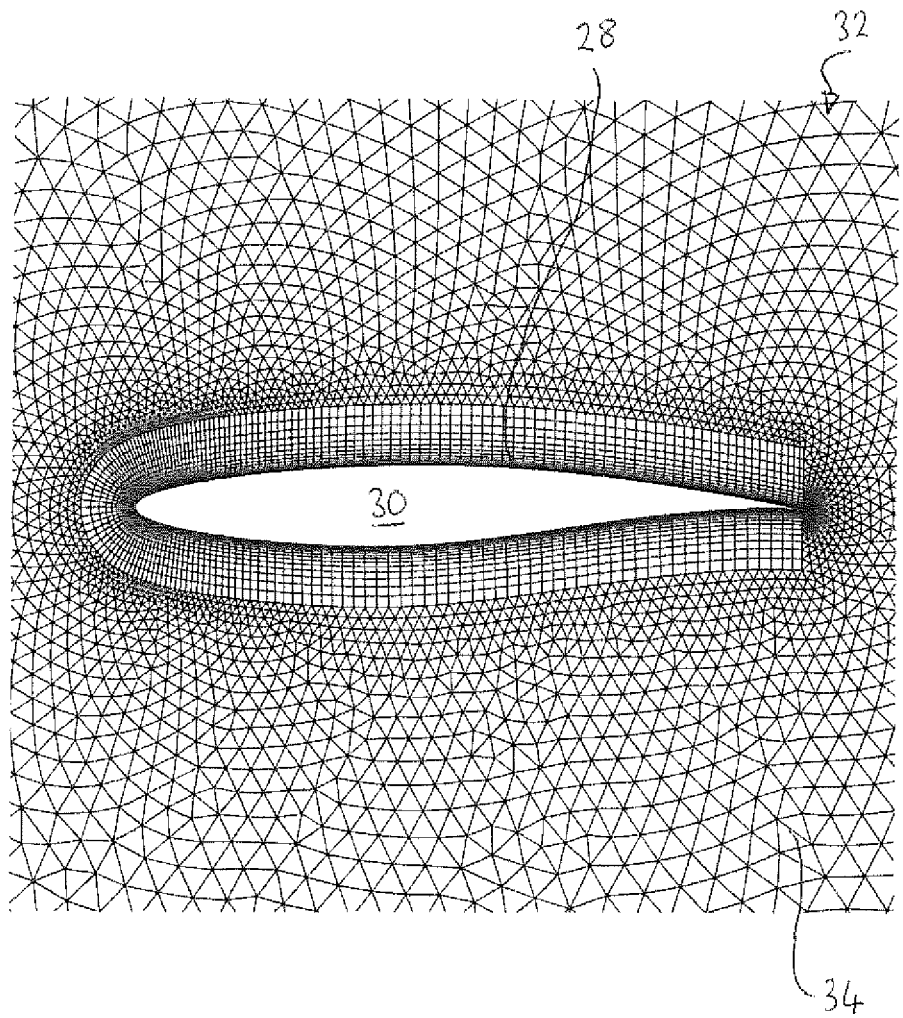
FIG. 2 shows a two-dimensional view of a meshed region of fluid flow about an aerofoil.

In this invention, an effective technique for detecting vortices from 2D computational fluid dynamics (CFD) data is proposed. Using conventional CFD tools or other computer aided engineering tools, it is possible to define the outer surface geometry 28 of a body 30 as shown in FIG. 2. A region of study 32 is defined in this example as an area around the body 30. In order to be able to determine fluid flow parameters of the flow about the body 30 a mesh 34 is applied to the region of flow 32 about the body 30. The mesh comprises a number of adjoining cells, thereby defining corresponding points throughout the mesh, either at the adjoining corners/nodes of the cells or else at the centre of each cells, depending on the relevant definition. Different types/shapes of cells may be used (e.g. including triangular and/or quadrilateral cells) as necessary.

In order to determine the relevant flow parameters at the points throughout the region 32, initial boundary conditions for the parameters are set and the flow parameters are calculated at each point using conventional algorithms, typically including equations for conservation of mass, energy and momentum. The algorithms iteratively converge to a resolved solution and the data output from the CFD comprises a record of each of the calculated flow parameters for the location of each point within the region of study 32.

This CFD output, typically provided as one or more data file is then processed in a manner according to the invention as will be described below with reference to FIGS. 3 and 4.

Figure 3:
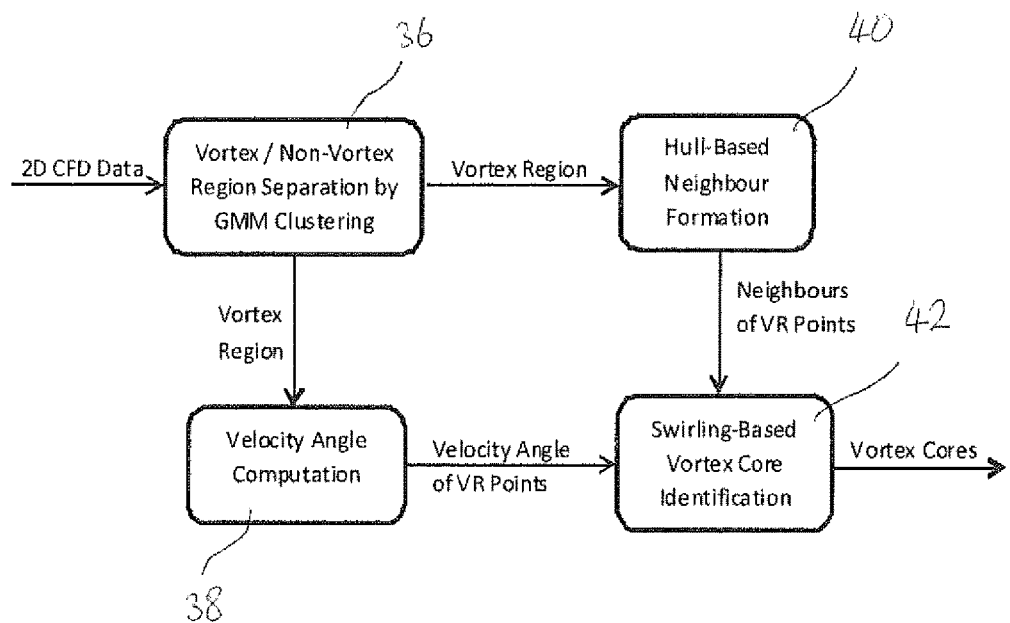
FIG. 3 shows the stages of a vortex identification technique according to one example of the invention.
Figure 4:
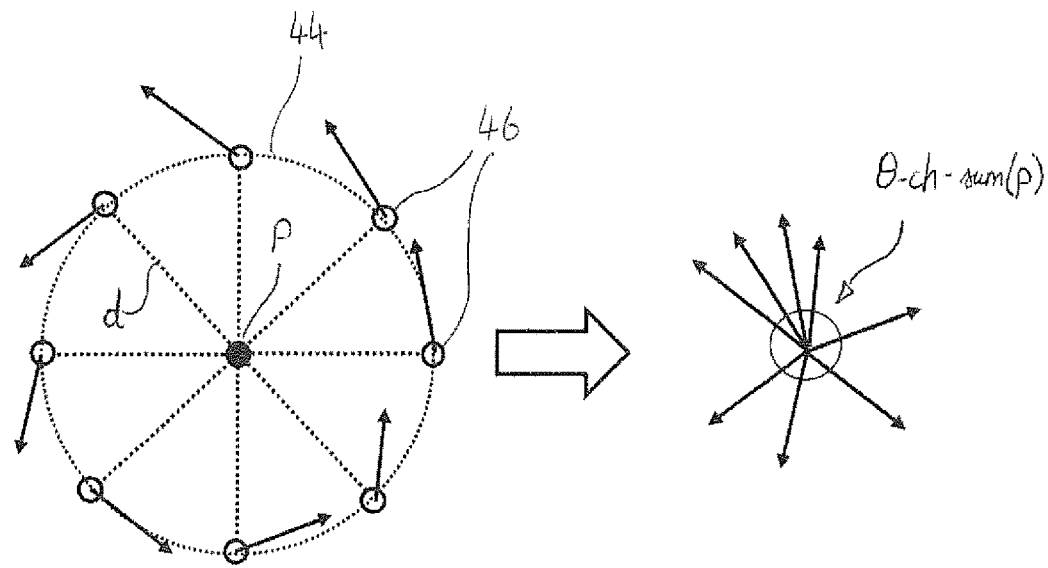
FIG. 4 shows further detail of a process for identifying a vortex core.

As shown in FIG. 3, the proposed technique for vortex identification consists of four stages, each of which may be enacted as a separate module:
(1) Vortex/non-vortex region separation 36;
(2) Velocity angle computation 38;
(3) Hull-based neighbour formation 40;
(4) Swirling-based vortex core identification 42.

The processes listed above may be carried out sequentially, e.g. in the order shown. However as shown in FIG. 3, the relative order in which velocity angle computation 38 and hull-based neighbour formation 40 is performed is not critical and those processes/modules may operate in parallel.

The Vortex/non-vortex region separation module 36 is responsible for separating vortex region from non-vortex region in the full flow field (i.e. the region of study). Herein, vortex region (VR) refers to the region in which one or more vortices are observed, while non-vortex region (non-VR) contains no vortices. The module 36 takes the raw CFD data as input.

A model-based machine learning technique is used to group the data points into VR or non-VR groups using probability distribution analysis. In this example a mixture model, in particular a Gaussian Mixture Model (GMM), is used to cluster the input data points into VR and non-VR. However a Gaussian distribution represents only one example of a suitable parametric family of distributions, i.e. defined according to a mean and variance, and it is possible that a mixture model involving other parametric families could be used, assuming good correlation between a particular model and the flow data to be interrogated.

The technique can be established on the basis that only two groups/clusters exist in the region of study and this value can be fixed within the mixture model.

Five primitive physical fluid/flow related attributes are considered in the learning process: density, pressure, and three components of the velocity vector, namely u, v, and w. The 'tied' covariance matrix is used in GMM, such that, in the learning process, VR and non-VR share the same covariance matrix. This common covariance matrix models the intrinsic relationship between the physical quantities of density, pressure and velocity, which is vortex-invariant.

However VR and non-VR groups are distinguished by different mean values of the tested attributes, which is vortex-variant. In this example, a threshold value of the tested attributes can be set as being a predetermined deviation/difference from the mean value of the VR distribution. Upper and/or lower thresholds can be set. A threshold may be set dependent upon the difference between the spacing between the mean values of the VR and non-VR groups. Alternatively the entirety of the points within the distribution for the VR group could be selected, i.e. wherein the threshold(s) represent one or more end point of the distribution. Points/portions of the flow region having values which meet/exceed the threshold value, or lie between threshold values, are recorded as being contained within VR.

Points found to correspond to a VR group for one flow variable may be compared with points found to correspond to a VR group for one or more of the other flow variables. The points found to be common to a plurality of VR groups may be selected as lying within a vortex region for the flow.

The output of this module is the set of points (i.e. locations in the region of study 32) that are clustered into VR by GMM. Whilst non-VR regions may also be identified (i.e. as points/portions of the flow region which do not lie in one or more VR group), these are not used further in this example.

The velocity angle computation module 38 computes the velocity angle for every point in VR. It takes the VR group of points obtained by the 'vortex/non-vortex region separation' module as input, e.g. as a point data file. For each point in VR, three components u, v, and w of its velocity vector are used for velocity angle computation. The output of this module is the velocity angle that accompanies each of the points in the VR group.

The angle may be determined by determining/resolving the resultant direction of motion within the defined two-dimensional plane of the fluid at the relevant point. The velocity angle may be defined with reference to a common direction or axis within the plane which may serve as a datum direction. The angles may be defined in a common direction, i.e. commonly handed in a clockwise or anticlockwise sense, relative the datum direction. Whilst it would also be possible to determine a resultant velocity vector in the plane of interest (i.e. comprising both magnitude and direction) the magnitude of the resultant velocity is less essential to the vortex detection and so it may or may not be determined according to different examples of the invention. The velocity angle has been found to serve as a particularly useful parameter in vortex detection since it is more closely matched to the manner in which visually perceives the presence or absence of a vortex within a fluid flow.

The hull-based neighbour formation module 40 serves to define, for each point in the VR group, a set of further points in the vicinity of that point. Those further points can then be used to assess whether or not the point under consideration lies within a vortex core. Whilst a specific hull-based example of this module is described below, it will be appreciated that any algorithms capable of identifying and storing a suitable set of neighbouring points for each point in the flow region or VR could be used.

The module 40 forms a neighbourhood for each point in VR. Herein, the neighbourhood of a point p refers to a set of points in VR that are spaced from p by a distance which lies within one or more threshold distance (i.e. sufficiently close to point p). In order to determine if a point p in VR is a vortex core, the selection of the number and/or distance of points to be included in p's neighbourhood is not arbitrary. Selection of a suitable number of points to include in a neighbourhood is an important consideration since increasing the number of points may incur high computational cost. Conversely, the use of too few points could fail to correctly identify a vortex core.

This example proposes to use a hull-based neighbourhood formation. Intuitively, it is sufficient to investigate the closest layer of points that cover p from 360° angle, i.e. that substantially surround p, in order to judge if p is a vortex core. This layer of points that 360°-cover p is named the hull of p and defined as the neighbourhood of p. The idea of the hull-based neighbourhood provides a novel vortex recognition method in which the contribution of neighboring points to a vortical flow pattern about a point is assessed. Thus we only have to look at a few points around a central point to make a vortex core judgment, which is localized and all-directional.

The hull-based neighbour formation processes every point p in VR as follows. First, it finds the nearest distance d from p to any other point in VR. The distance is defined by the Euclidean distance of point locations. A circle 44 can then be defined with p as the center and d as the radius. Then eight landmark points are located on the circle starting at 0 degree of p and with a step of 45 degree of p. Next for each landmark point, the VR point that is the nearest to the landmark point is identified from the available points in the flow field (i.e. at which values of the relevant flow variables are known). Finally, these nearest VR points to the landmarks form the hull of p and are output to the vortex core identification stage 42.

The proposed neighbour formation has several advantages. It avoids the specification of parameters such as either k in a so-called k-nearest-neighbours approach and/or the radius in a radius-based-neighbours approach. The current approach is able to automatically adjust the size of the neighbor set based on the grid density. Furthermore this approach ensures all-direction coverage of p as well as ensuring a good fit for the generally circular/spherical nature of vortices.

The swirling-based vortex core identification module 42 is responsible for identifying vortex cores by processing the neighbours and their velocity angles for each point in VR. The approach is intended to identify a vortex by a fundamental and inherent nature of all vortices, that is, their swirling nature. Thus the invention considers that a vortex exists when particles swirl around a centre (i.e. when a vortex core can be identified by the direction of flow there-about). Therefore, for a vortex core, both the location and the velocity angle of the points around it wind the core by a substantially complete revolution, e.g. 360 degree. The hull-based neighbourhood approach described above ensures that the neighbouring points surround, as far as possible, a point under analysis, while the swirling-based core identification is proposed to determine whether the velocity angles create the required swirling flow for a vortex to be established.

The swirling-based vortex core identification module processes every point p in VR as explained below.

Firstly the module orders the points in hull(p) by their relative position to p. In order to do this, the origin of the coordinate system is first changed to p for every point in hull(p); the coordinate system is then changed from the Cartesian system to the polar coordinate system; and the points in hull(p) are ordered by their angular coordinates. Second, the algorithm computes the velocity angle change, denoted as θ-ch, for every two circularly ordered points in hull(p). The velocity angles may be summed with a common sense, for example such that each value of θ-ch may have a positive or negative value. For example, if there are 3 ordered points in hull(p), v1, v2, and v3, θ-ch is computed for (v1, v2), (v2, v3), and (v3, v1). Next all θ-ch values are summed up for p, denoted as θ-ch-sum(p). The summation may be taken in sequential order of the points in hull(p), e.g. in a clockwise or anticlockwise order.

Finally, the points with θ-ch-sum(p) of $2\pi$ (or $-2\pi$) are returned as vortex cores. It has been found that strict adherence to the summation of the velocity angles to $2\pi$ may be a suitable requirement for accurate vortex centre identification. For example a vortex centre may be identified when the summations is within any of 1%, 0.1%, or even 0.01%, depending on the level of accuracy required. It has been found that deviation from the 2π value for a vortex centre is usually of the order of 0.001%, typically due only to the accuracy with which calculations are performed. In other examples, a threshold of slightly less than 2π may be selected, such as for example 5% or 10% less than 2π as necessary in order to ensure that other, related flow phenomena are caught. In such an example the values of the velocity angle summation may be logged and, if the summation does not equal 2π for any point, then a search may be performed for the value closest to 2π. In any local vicinity or region of the flow domain, this summation may provide useful information about the local flow phenomenon.

The proposed swirling-based vortex core identification has several advantages. It is able to identify precisely vortex cores. The high precision comes from a sufficient and necessary condition for vortex core: the swirling angle of the surrounding points accumulates to 2π. Furthermore it does not require any user-input parameters to tailor the tool to suit specific flow conditions.

Although the method described is primarily for 2D data, it can be extended to the detection of vortex in 3D simulation data by defining a plurality of 2D planes over the 3D region of interest. Thus the 3D point data and corresponding flow parameter values can be arranged into appropriate 2D planes for vortex identification as descried above.

In any of the above-described examples of the invention, one or more further vortex characteristic may be determined, such as a vortex length/width dimension. A distance from the vortex core to one or more outlying points within the vortex may be determined.

Turning back to the examples of FIGS. 1 and 2, if a vortex is identified that is adjacent or impinging upon the fluid washed surface of the component under analysis, changes in the component geometry can be implemented to determine the changes in the flow pattern and whether those changes cause the vortex core to move away from the component surface. Thus a variety of different geometries may be explored to determine the impact on the formation of one or more vortex and its location. Thus a preferred geometry can be selected for implementation in which the impact of vortices on flow efficiency have been eliminated or reduced as far as possible under other stipulated operational/geometric constraints.

The invention claimed is:

1. A vortex core detection method for designing, by a processor, a fluid washed component, the method comprising:

identifying a plurality of points at locations over a region in which a vortex detection is to be performed;

determining a plurality of relevant flow parameters at the plurality of points throughout the region;

setting a plurality of boundary conditions for the plurality of relevant flow parameters and calculating the plurality of relevant flow parameters at each of the plurality of points throughout the region;

grouping the plurality of points as being contained in a vortical flow portion or a non-vortical flow portion of the region according to one or more statistical distribution for the plurality of fluid flow parameters;

selecting a first point from a plurality of points within the vortical flow portion;

defining a circle based on the first point as a center of the circle and a radius equal to a distance between the first point and a nearest point of the plurality of points within the vortical flow portion;

locating a plurality of landmark points on the defined circle based on a predefined angle;

determining a set of second points for each landmark point of the plurality of landmark points, each of the second points of the set of second points being a point selected from the plurality of points within the vortical flow portion that is nearest to the corresponding landmark point;

identifying and outputting a vortex core among the set of second points based on a direction of motion of the set of second points; and designing or modifying a design of the fluid washed component for manufacturing of the component based on the outputted vortex core.

2. The vortex detection method according to claim 1, wherein the plurality of points are grouped according to a mixture model.

3. The vortex detection method according to claim 2, wherein the mixture model includes a plurality of mixture weightings, a sum of the plurality of mixture weightings equaling one.

4. The vortex detection method according to claim 1, wherein the plurality of fluid flow parameters are distributed according to a mixture of components, with each component of the mixture of components belonging to a common parametric family of distributions.

5. The vortex detection method according to claim 1, wherein the plurality of fluid flow parameters includes density, pressure and velocity.

6. The vortex detection method according to claim 1, further comprising, for the first point contained in vortical flow portion, identifying an array of landmark points surrounding the first point and identifying the direction of motion of each of the further points in the array.

7. The vortex detection method according to claim 6, further comprising identifying a distance of a closest point from the first point, identifying further locations spaced about the first point by the distance and identifying the remaining landmark points of the array based on a proximity of the first point to the further locations.

8. The vortex detection method according to claim 6, wherein the landmark points are substaintially equally angularly spaced about the first point.

9. The vortex detection method according to claim 6, wherein the array includes six or eight or more landmark points.

10. The vortex detection method according to claim 6, wherein an array of further points is identified for every point in the vortical flow portion.

11. The vortex detection method according to claim 1, wherein a velocity angle is determined for each of the landmark points, a vortex core being identified based upon a change in velocity angle between the landmark points in a vicinity of a first point.

12. The vortex detection method according to claim 11, wherein the change in velocity angle between each landmark point and an adjacent landmark point is determined and a vortex core is identified upon an aggregate of the changes in velocity angle between the landmark points about the first point satisfying a predetermined threshold value.

13. The vortex detection method according to claim 11, wherein the change in velocity angle between adjacent landmark points is determined.

14. The vortex detection method according to claim 1, wherein the first point and the landmark points are defined in a common plane.

15. The vortex detection method according to claim 1, wherein the region in which vortex detection is performed is divided into multiple cells by application of a mesh over the region, each cell including a point of the plurality of points.

16. The vortex detection method according to claim 1, further comprising defining a geometry of the surface within a computational model of a fluid flow region in which vortex identification method is to be performed.

17. A non-transitory computer readable storage medium comprising machine readable instructions to control one or more processors to perform the method according to claim 1.

18. A vortex core detection tool for designing a fluid washed component, the vortex detection tool comprising:
   a memory storing location data for a plurality of points over a fluid region in which a vortex detection is to be performed, and a plurality of relevant flow parameters at each point of the plurality of points; and
   one or more processors configured to:
      identify the plurality of points at locations over the fluid region in which the vortex detection is to be performed;
      determine the plurality of relevant flow parameters at the plurality of points throughout the fluid region;
      set a plurality of boundary conditions for the plurality of relevant flow parameters and calculate the plurality of relevant flow parameters at each of the plurality of points throughout the fluid region;
      group the points as being contained in either a vortical flow portion or non-vortical flow portion of the fluid region according to one or more statistical distributions of the plurality of relevant flow parameters;
      select a first point from a plurality of points within the vortical flow portion;
      define a circle based on the first point as a center of the circle and a radius equal to a distance between the first point and a nearest point of the plurality of points within the vortical flow portion;
      locate a plurality of landmark points on the defined circle based on a predefined angle;
      determine a set of second points for each landmark point of the plurality of landmark points, each of the second points of the set of second points being a point selected from the plurality of points within the vortical flow portion that is nearest to the corresponding landmark point;
      identify and output a vortex core among the set of second points based on a direction of motion of the set of second points; and
      designing or modifying a design of the fluid washed component for manufacturing of the component based on the outputted vortex core.

* * * * *